United States Patent

Tsujita

(10) Patent No.: US 8,085,386 B2
(45) Date of Patent: Dec. 27, 2011

(54) METHOD FOR DETERMINING EXPOSURE CONDITION AND COMPUTER-READABLE STORAGE MEDIA STORING PROGRAM FOR DETERMINING EXPOSURE CONDITION

(75) Inventor: Kouichirou Tsujita, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 420 days.

(21) Appl. No.: 11/869,606

(22) Filed: Oct. 9, 2007

(65) Prior Publication Data

US 2008/0151210 A1 Jun. 26, 2008

(30) Foreign Application Priority Data

Dec. 22, 2006 (JP) ................... 2006-346256

(51) Int. Cl.
 *G03B 27/32* (2006.01)
 *G03B 27/34* (2006.01)
 *G03B 27/42* (2006.01)
(52) U.S. Cl. .............. 355/77; 355/56; 355/53
(58) Field of Classification Search .......... None
 See application file for complete search history.

(56) References Cited

U.S. PATENT DOCUMENTS

| | | | |
|---|---|---|---|
| 5,465,220 A | 11/1995 | Haruki et al. | |
| 6,219,630 B1 * | 4/2001 | Yonezawa et al. | 703/14 |
| 6,562,638 B1 * | 5/2003 | Balasinski et al. | 438/14 |
| 6,928,636 B2 * | 8/2005 | Ohnuma | 716/53 |
| 6,944,844 B2 * | 9/2005 | Liu | 716/52 |
| 7,386,830 B2 * | 6/2008 | Fukuhara | 716/53 |
| 7,393,616 B2 * | 7/2008 | Huang et al. | 430/5 |
| 7,403,649 B2 * | 7/2008 | Cai et al. | 382/141 |
| 7,459,243 B2 * | 12/2008 | Sasaki | 430/5 |
| 7,642,022 B2 * | 1/2010 | Yoshii et al. | 430/30 |
| 2007/0035716 A1 * | 2/2007 | Yoshii et al. | 355/77 |
| 2007/0168898 A1 * | 7/2007 | Gupta et al. | 716/9 |
| 2009/0180097 A1 * | 7/2009 | Yoshii et al. | 355/77 |

FOREIGN PATENT DOCUMENTS

| | | |
|---|---|---|
| EP | 1500974 A2 | 1/2005 |
| JP | 6-120119 A | 4/1994 |
| JP | 2005-026701 A | 1/2005 |
| JP | 2005-258080 A | 9/2005 |

\* cited by examiner

*Primary Examiner* — Edward Glick
*Assistant Examiner* — Deoram Persaud
(74) *Attorney, Agent, or Firm* — Canon USA Inc IP Division

(57) ABSTRACT

A method for determining an exposure condition for use in projecting an image of a pattern of an original on a substrate includes a setting step of setting an exposure condition, an image calculating step of calculating a dimension of an image to be projected on the substrate under the set exposure condition, an electrical characteristic calculating step of calculating an electrical characteristic of at least one of a portion for use as an interconnection and a portion for use as a transistor in a pattern to be formed on the substrate in accordance with a result calculated in the image calculating step, a determining step of determining whether the electrical characteristic calculated in the electrical characteristic calculating step satisfies a requirement, and an adjusting step of adjusting the set exposure condition when the electrical characteristic is determined not to satisfy the requirement in the determining step.

6 Claims, 14 Drawing Sheets

METHOD FOR DETERMINING EXPOSURE CONDITION AND COMPUTER-READABLE STORAGE MEDIA STORING PROGRAM FOR DETERMINING EXPOSURE CONDITION

BACKGROUND OF THE INVENTION

1. Field of the Invention

The present invention relates to a method for determining an exposure condition and a computer-readable storage medium that stores a program for determining an exposure condition.

2. Description of the Related Art

Exposure is the process most important in determining a line width in a circuit pattern of a semiconductor device in the manufacture of a semiconductor device. In exposure, an original is illuminated by an illumination optical system with light from a light source, an image of a pattern of the original is projected on a photosensitive material applied onto a substrate and exposure is made through a projection optical system. This processing is performed by an exposure apparatus.

Exposure apparatuses that use a technique for achieving higher resolution are being developed because circuits are required to have smaller line width compared with a wavelength of light of a light source used in exposure. Examples of parameters that determine resolution include a wavelength of light of a light source, a numerical aperture (NA) of a projection optical system, and a process-dependent numerical value, so-called a process factor k1. Examples of techniques for achieving higher resolution, as described above, include increasing NA and reducing k1. Examples of techniques for reducing k1 include modified illumination, polarized illumination, and adjustment of an aberration in a projection optical system.

The number of techniques for achieving high resolution is increasing and such techniques are becoming increasingly complicated. Therefore, in order to project a pattern onto a substrate and expose the substrate with high accuracy, it is desirable to appropriately set a condition for exposure (i.e., an exposure condition) by setting various parameters (e.g., the shape of illumination light (hereinafter referred to as an illumination shape), NA, aberration, the state of polarization of illumination light) by making full use of the above techniques.

One approach is a method for determining an illumination shape for optimally resolving a pattern by simulation. For example, Japanese Patent Laid-Open No. 6-120119 discloses a method that sets initial values of an optical condition (e.g., NA, wavelength, σ) and an illumination shape, calculates a pattern image on the surface of a substrate when a pattern of an original is projected on the substrate, and alters the illumination shape repeatedly until the pattern image is as close to a target pattern image as possible.

Japanese Patent Laid-Open No. 2005-26701 discloses a method for optimizing optical proximity correction and parameters for use in an exposure apparatus. Examples of the parameters for use in an exposure apparatus include NA and σ. Examples of the optical proximity correction include change of a line width in a designed pattern and addition of a supplement pattern that is not to be resolved.

Also in the method disclosed in this patent document, a pattern image to be projected on a substrate is calculated by simulation, as in Japanese Patent Laid-Open No. 6-120119, and exposure conditions including parameters for use in an exposure apparatus and optical proximity correction for a layout pattern are repeatedly modified until the pattern image to be projected on the substrate is as close to a target pattern image as possible.

The methods disclosed in both patent documents determine an exposure condition that enables a target pattern to be optimally reproduced on a substrate. This reduces the number of defects in resolving a pattern formed on the substrate.

Whether a produced device is defective or non-defective is determined by inspection of electrical characteristics of the device. Therefore, a device that has irregular line widths in an evaluation pattern formed on the substrate may be determined to be a non-defective product, and, on the contrary, a device that has a uniform line width in an evaluation pattern formed on the substrate may be determined to be a defective product. In other words, optimal reproduction of a target pattern on the substrate and manufacturing yield of devices do not completely match each other.

As a result, in order to enhance manufacturing yield of devices, it is necessary to consider electrical characteristics of devices to be produced in setting exposure conditions.

SUMMARY OF THE INVENTION

The present invention provides a method for determining an exposure condition that enables improvement in manufacturing yield of devices and a computer-readable storage medium that stores a program for determining an exposure condition.

According to a first aspect of the present invention, a method for determining an exposure condition for use in projecting an image of a pattern of an original on a substrate is provided. The method is executable by a computer. The method includes a setting step of setting an exposure condition, an image calculating step of calculating a dimension of an image to be projected on the substrate under the exposure condition set in the setting step, an electrical characteristic calculating step of calculating an electrical characteristic of at least one of a portion for use as an interconnection and a portion for use as a transistor in a pattern to be formed on the substrate in accordance with a result calculated in the image calculating step, a determining step of determining whether the electrical characteristic calculated in the electrical characteristic calculating step satisfies a requirement, and an adjusting step of adjusting the exposure condition set in the setting step when the electrical characteristic is determined not to satisfy the requirement in the determining step.

According to a second aspect of the present invention, a method for determining an exposure condition for use in projecting an image of a pattern of an original on a substrate is provided. The method is executable by a computer. The method includes a designing step of designing a layout of a device, a setting step of setting an exposure condition, an image calculating step of calculating a dimension of an image to be projected on the substrate under the exposure condition set in the setting step, an electrical characteristic calculating step of calculating an electrical characteristic of at least one of a portion for use as an interconnection and a portion for use as a transistor in a pattern to be formed on the substrate in accordance with a result calculated in the image calculating step, a determining step of determining whether the electrical characteristic calculated in the electrical characteristic calculating step satisfies a requirement, and a modifying step of modifying the layout designed in the designing step when the electrical characteristic is determined not to satisfy the requirement in the determining step.

Further features and aspects of the present invention will become apparent from the following description of exemplary embodiments with reference to the attached drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DESCRIPTION OF THE EMBODIMENTS

Various embodiments, features and aspects of the present invention will now be described in detail in accordance with the accompanying drawings.

An exemplary process of manufacturing a semiconductor device as the basis of embodiments is described with reference to FIGS. 3 and 4.

Figure 3:
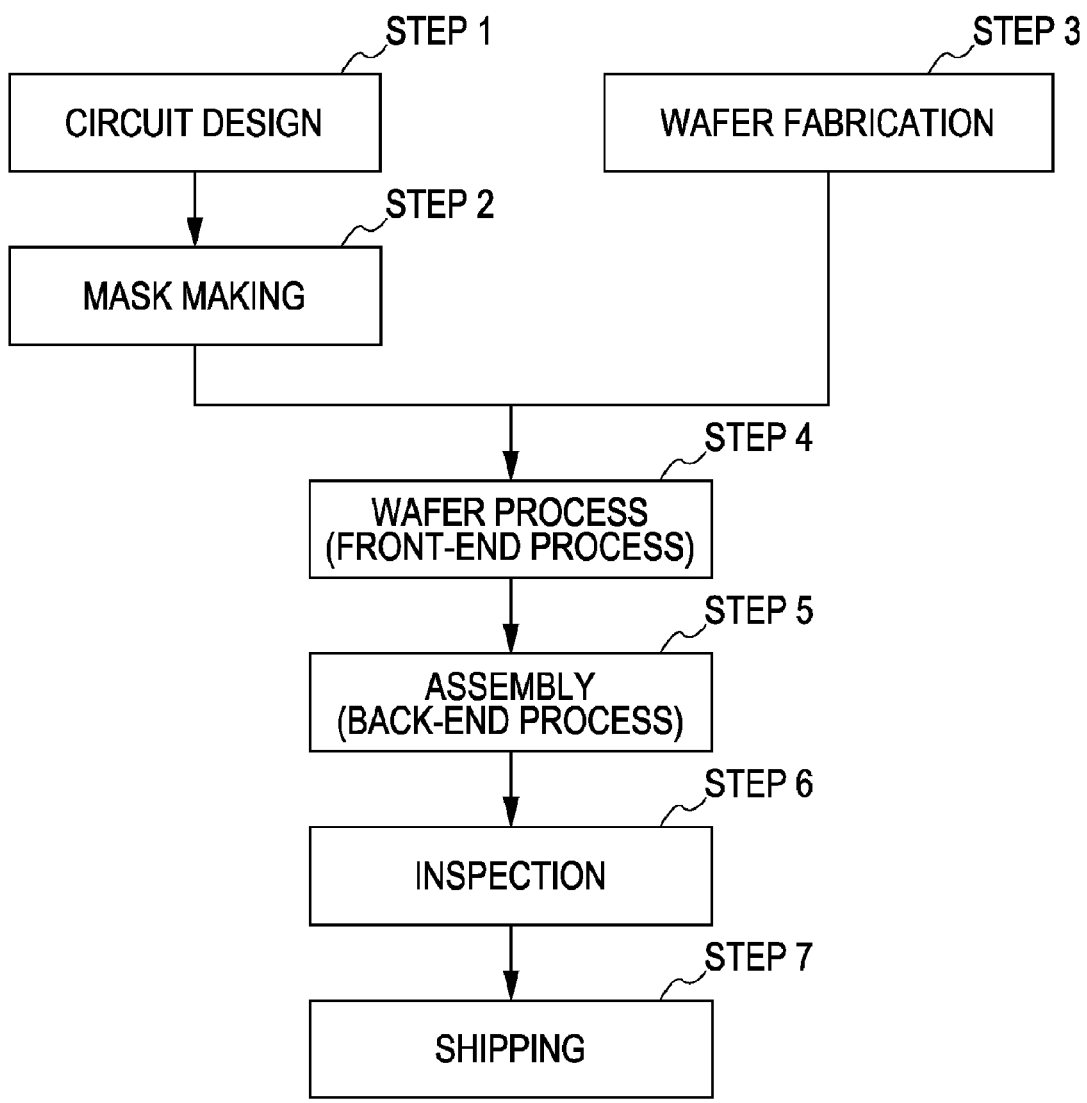
FIG. 3 illustrates an example device manufacturing process.

FIG. 3 is a flowchart for describing the process of manufacturing a semiconductor device. Examples of the semiconductor device include a semiconductor chip (e.g., a large-scale integrated circuit (LSI), an integrated circuit (IC), and memory), a liquid crystal panel, a charge-coupled device (CCD), and a complementary metal-oxide semiconductor (CMOS) sensor. Here, manufacture of a semiconductor chip is described as an example.

Referring to FIG. 3, in step 1 (circuit design), circuitry of a semiconductor chip is designed. In step 2 (mask making), a mask in which a designed circuit pattern is formed is produced. In step 3 (wafer fabrication), a wafer is produced using a material, such as silicon. In step 4 (wafer process), which is called a front-end process, an actual circuit is formed on the wafer using the mask by lithography. In step 5 (assembly), which is called a back-end process, the wafer formed in step 4 is made into a chip, and this process includes assembly (dicing and bonding), packaging (chip encapsulation), and other processing. In step 6 (inspection), the semiconductor device formed in step 5 is subjected to inspection, such as an operation check and a durability test. In step 7 (shipping), the completed semiconductor device after these steps is shipped.

Figure 16:
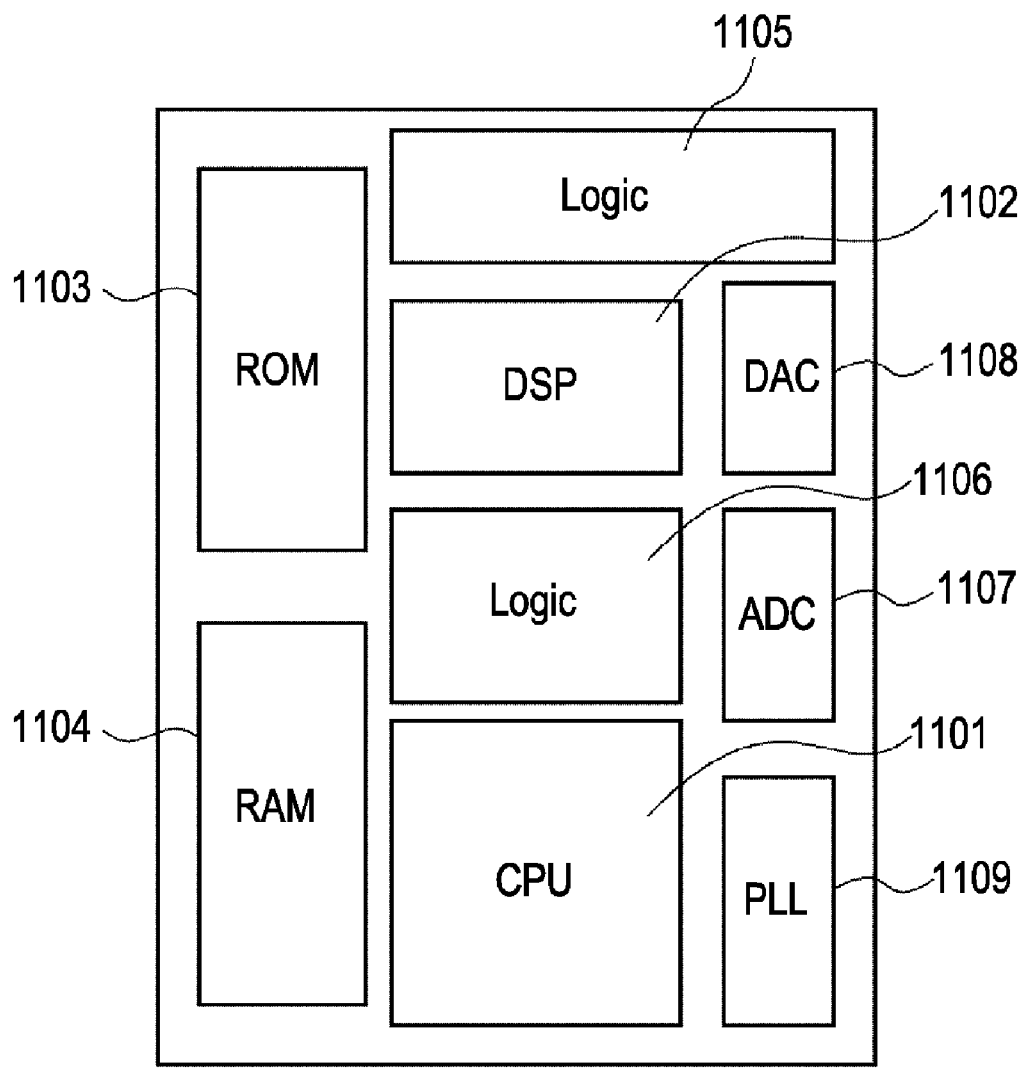
FIG. 16 illustrates a layout of blocks in an LSI.

The circuit design in step 1 will now be described. Design of an LSI will be described as an example. In LSI design, first, the system is designed. In system design, the specifications of an LSI are made such that, for example, the system is divided into hardware and software and the hardware is divided into blocks. A typical LSI includes unitary circuits (hereinafter referred to as blocks). Examples of the blocks include from a circuit having a small logic gate (e.g., a flip-flop circuit) to a large-scale circuit (e.g., a central processing unit (CPU) and a digital signal processor (DSP)). For example, as illustrated in FIG. 16, a single LSI includes blocks (also called macrocells) of a CPU 1101, DSP 1102, read-only memory (ROM) 1103, random-access memory (RAM) 1104, Logic 1105 and 1106, analog-to-digital converter (ADC) 1107, digital-to-analog converter (DAC) 1108, and phase-locked loop (PLL) 1109.

Next, the logical design of the LSI is performed. In logical design, a specific logic circuit for implanting the system designed in system design by hardware is automatically generated. A gate-level logic circuit in a transistor being a circuit element of a semiconductor device is finally generated.

Then, the layout of the LSI is designed. In layout design, arrangement of the blocks including gate-level logic circuits in the LSI chip is specified, and an interconnection between these blocks is designed.

Data of a circuit pattern for an LSI in which up to layout design has been completed as described above (hereinafter referred to as layout data) is used in the embodiments, which will be described below. Hereinafter, such a circuit pattern is referred to as a layout pattern. Data of a layout pattern to which a supplement pattern considering optical proximity correction is added may be used.

Figure 4:
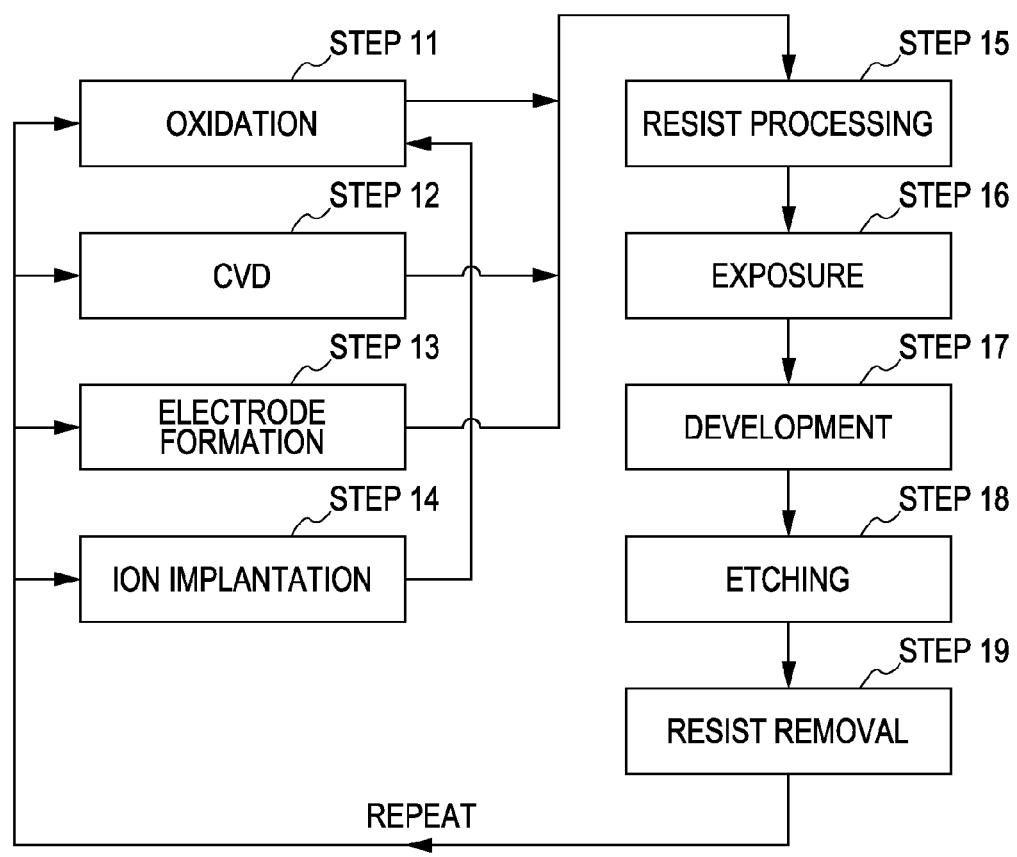
FIG. 4 illustrates an example wafer process.

FIG. 4 is a flowchart that illustrates the details of the wafer process shown in step 4 in FIG. 3. In step 11 (oxidation), the surface of a wafer is oxidized. In step 12 (CVD), an insulating film is formed on the surface of the wafer. In step 13 (electrode formation), an electrode is formed on the wafer by, for example, vapor deposition. In step 14 (ion implantation), ions are implanted into the wafer. In step 15 (resist processing), a photosensitive material is applied to the wafer. In step 16 (exposure), the wafer is exposed to create a circuit pattern of a mask on the wafer by an exposure apparatus described below. In step 17 (development), the exposed wafer is developed. In step 18 (etching), a portion other than the developed resist image is removed. In step 19 (resist removal), the unnecessary resist after etching is removed. By repeating these steps, multiple circuit patterns are formed on the wafer.

The exposure apparatus used in exposure shown in step 16 in FIG. 4 is described with reference to FIG. 5. Light emitted from a light source 1 is converted into a light beam having a predetermined shape by a beam shaping optical unit 2. The light source 1 can be an extra-high pressure mercury lamp or an excimer laser. An optical unit 3 includes a condenser optical part, an optical rod, and a zoom lens. The zoom lens forms an image of light intensity distribution adjacent to an exit surface of the optical rod on an incident surface 6a of a fly-eye lens 6 with a predetermined magnification. By use of the zoom lens, the size of the cross section of a light beam incident on the fly-eye lens 6 can be adjusted and the light intensity distribution can be changed. The optical unit 3 includes, as an illumination-shape setting unit, an optical element for forming an annular illumination, a dipole illumination, and/or a quadrupole illumination from a light beam from the optical rod.

The fly-eye lens 6 includes a two-dimensional array of minute lens elements. An area adjacent to an exit surface 6b corresponds to a pupil plane of an illumination optical system 4. The fly-eye lens 6 can be replaced with two sets of cylindrical lens arrays.

An aperture stop 7 used for blocking unnecessary light and allowing light to has a predetermined illumination shape is disposed at the pupil plane of the illumination optical system 4. The size and shape of the aperture of the aperture stop 7 can be changed by an aperture driving mechanism (not shown).

A field stop 9 is illuminated with light having a given shape from a secondary light source adjacent to the exit surface 6b of the fly-eye lens 6 (at the pupil plane) via an illumination lens 8 with a uniform light intensity distribution. The field stop 9 includes a plurality of movable light-shielding plates. The field stop 9 can have any opening shape so as to limit an exposure range on a surface of a mask (reticle) 13 and a surface of a wafer 15, both of the surfaces being a target illumination surface. Imaging lenses 10 and 11 form an image having the opening shape of the field stop 9 on the mask 13, which is an original. Reference numeral 12 denotes a deflecting mirror.

The mask 13 is supported by a mask stage 17. The driving of the mask stage 17 is controlled by a mask-stage driving device (not shown).

A projection optical system 14 projects an image of a mask pattern illuminated by the illumination optical system 4 on the wafer 15, which is a substrate. When the mask 13 and the mask stage 17 are moved from the optical path, a light quantity distribution (light intensity distribution) analogous to the illumination shape at the pupil plane of the illumination optical system 4 is formed at the pupil plane of the projection optical system 14. The illumination shape at the pupil plane of the illumination optical system 4 corresponds to an angle distribution of exposure light incident on the surface of the mask 13 and is associated with a light quantity distribution (light intensity distribution) of light formed at a pupil plane 14e of the projection optical system 14. The pupil plane 14e of the projection optical system 14 is conjugate to the pupil plane of the illumination optical system 4.

The wafer 15 is supported by a wafer stage 18. The wafer stage 18 is movable along an optical axis of the projection optical system 14 and a plane perpendicular to the optical axis. The driving of the wafer stage 18 is controlled by a wafer-stage driving device (not shown).

A two-dimensional image sensor 16 measures the quantity of light incident on the wafer 15. A CCD can be used as the two-dimensional image sensor 16, for example. The two-dimensional image sensor 16 moves together with the driving of the wafer stage 18 and receives illumination light in an illumination region. The two-dimensional image sensor 16 transmits a signal in accordance with the received light to a main control device 20. The quantity of light measured by the two-dimensional image sensor 16 corresponds to the light quantity distribution (intensity distribution) at the pupil plane of the projection optical system 14.

The illumination optical system 4 is constituted of the optical components from the beam shaping optical unit 2 downstream to the imaging lens 11.

The provision of an instruction for driving an optical element (e.g., the lens in the optical unit 3) to an actuator 22 from the main control device 20 enables the optical element to be driven, a light beam from the light source to be converted into a desired shape, and the illumination shape at the pupil plane of the illumination optical system 4 to be adjusted.

A controller 21 controls driving of optical elements 14a to 14d in the projection optical system 14 in accordance with an instruction from the main control device 20.

Figure 5:
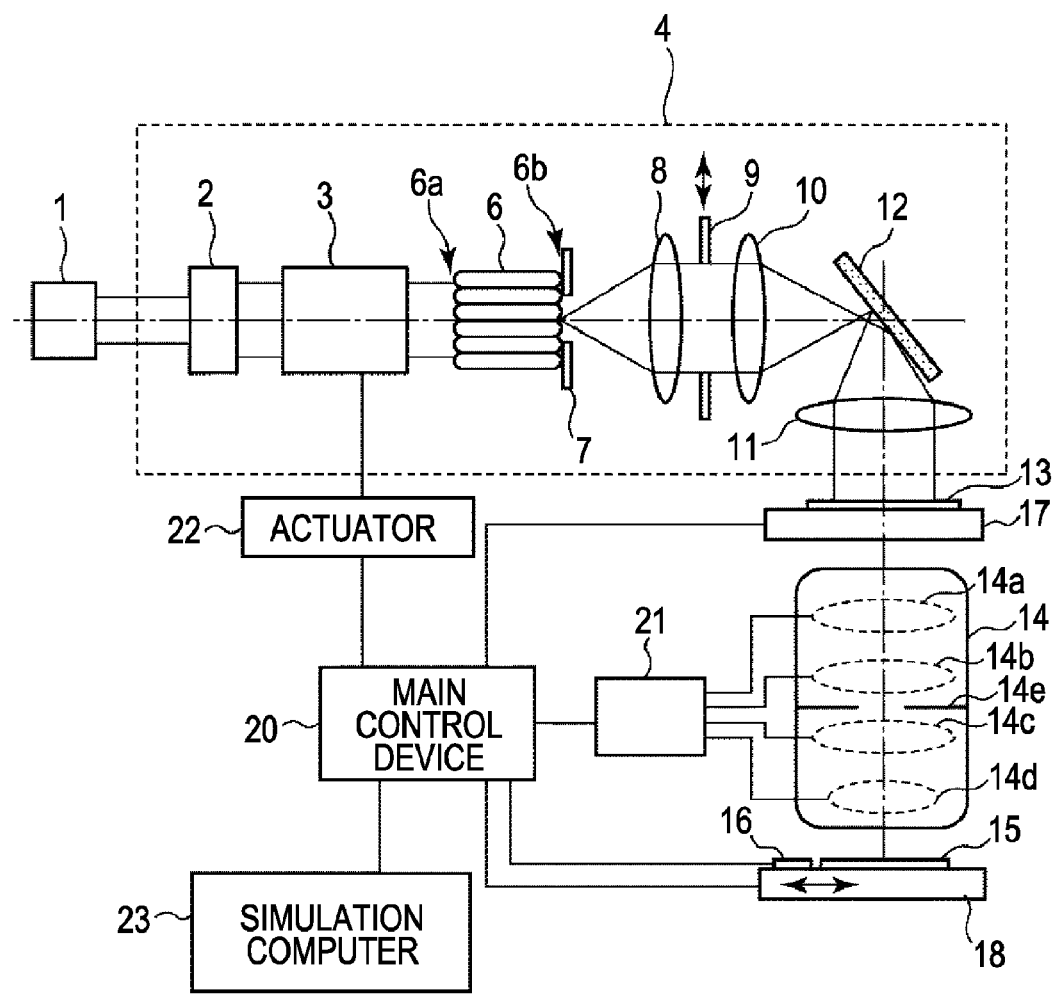
FIG. 5 is a diagram of an example exposure apparatus.

The exposure apparatus includes the components 2 to 22 illustrated in FIG. 5. The light source 1 is typically disposed outside the exposure apparatus. However, the light source 1 may be provided integrally with the exposure apparatus. A simulation computer 23 may be provided integrally with the exposure apparatus, or alternatively, be provided outside the exposure apparatus and connected thereto over a wired or wireless network.

The exposure condition will now be described. The exposure condition is an optical condition, such as a wavelength and a wavelength distribution of a light source, a numerical aperture in a projection optical system, a numerical aperture NA at an exit side in an illumination optical system, σ value (defined below), a light intensity distribution at a pupil plane in an illumination optical system (including dipole and annular illumination shapes), and an aberration in a projection optical system. Alternatively, the exposure condition is a condition defined by combinations of the optical condition and information on a mask pattern (e.g., a layout pattern and a supplement pattern). The σ value is the numerical aperture at an exit side in an illumination optical system divided by the numerical aperture at an incident side in a projection optical system.

First Exemplary Embodiment

The first embodiment will be described below with reference to the drawings.

Figure 6:
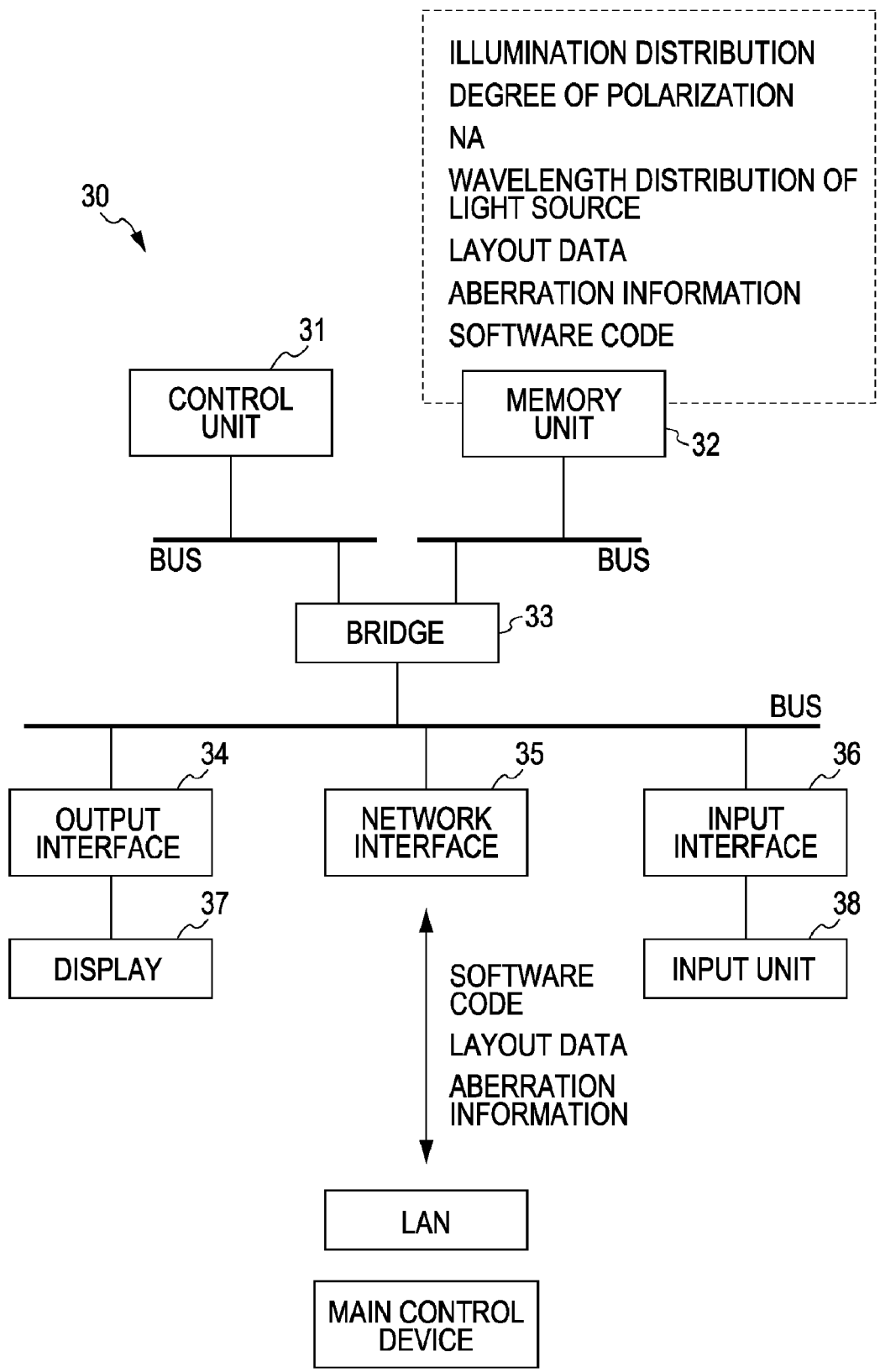
FIG. 6 is a block diagram of an example computer that executes a program for determining an exposure condition.

FIG. 6 is a block diagram of a computer that executes a program for determining an exposure condition. The computer corresponds to the simulation computer 23 illustrated in FIG. 5.

Referring to FIG. 6, a computer 30 includes a control unit 31, a storage unit 32, a bridge 33, an output interface 34, a network interface 35, and an input interface 36. The elements 31, 32, 34, 35, and 36 are connected to the bridge 33 via a bus. The output interface 34 is connected to a display 37. The input interface 36 is connected to an input unit 38. The network interface 35 is connected to a network, such as a LAN, so data can be exchanged with other computers. The network interface 35 is connected to the main control device 20 in the exposure apparatus, which is previously described.

A specific example structure of each unit is described below. The control unit 31 can be a CPU, a DSP, a field-programmable gate array (FPGA), and a microcomputer. The storage unit 32 can be a memory, such as a ROM or a RAM. The input unit 38 can be a mouse and a keyboard. The control unit 31 executes software code (program) and a data operation on the basis of information stored in the storage unit 32 and displays a result of the operation on the display 37 if needed. Examples of the information stored in the storage unit 32 include a light quantity distribution (illumination distribution or intensity distribution) at the pupil plane of the illumination optical system, which will be described below, the degree of polarization of illumination light, NA, a wavelength distribution of (illumination light of) the light source, layout data for a device, information on an aberration in the projection optical system, and program software code. The information on an aberration in the projection optical system and the layout data are stored in the storage unit 32 via the network interface 35. The program software code may be preinstalled in the computer 30 and stored in the storage unit 32. Alternatively, the program software code may be downloaded via a network. In this case, the software code is stored via the network interface 35.

Figure 1:
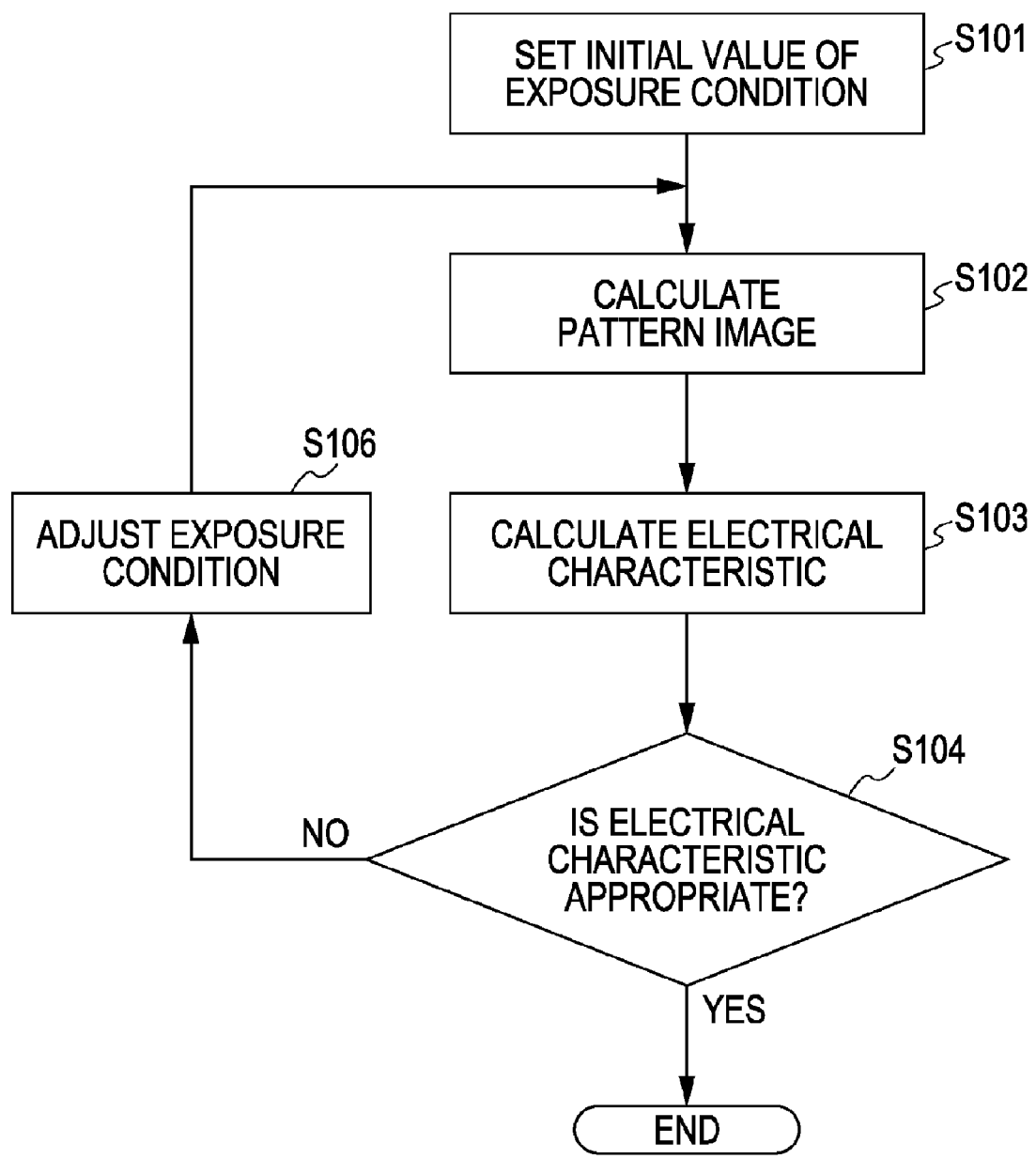
FIG. 1 illustrates an example processing flow in determining an exposure condition according to a first embodiment of the present invention.

A flow of processing performed by a program for determining an exposure condition will now be described with reference to FIG. 1. First, in step S101, an initial value of an exposure condition is set. In this embodiment, the initial value of, as the exposure condition, each of the wavelength distribution of the light source, the numerical aperture NA at the exit side in the illumination optical system, the light intensity distribution at the pupil plane in the illumination optical system, and the degree of polarization of illumination light is set.

Because resolution may decrease when a spectrum width in which 95% of the entire energy of light of the light source is concentrated, so-called "E95", is large, the minimum value of E95 is set as the initial value of the wavelength distribution of the light source. The maximum NA is set as its initial value because a higher NA is desired except for the depth of focus (DOF).

Figure 8:
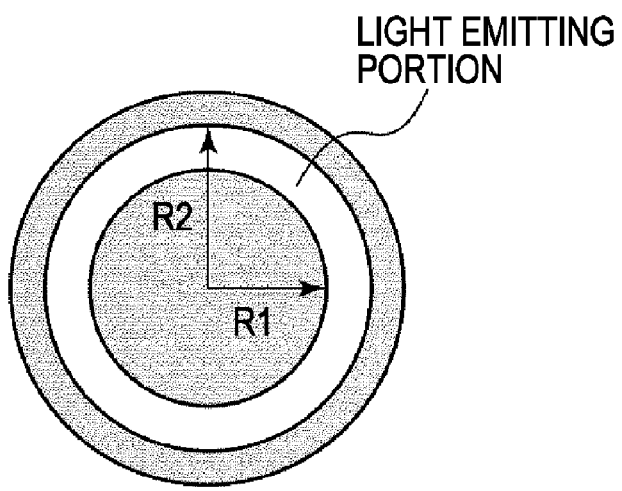
FIG. 8 is an illustration for describing parameters for an annular illumination represented by a function.
Figure 9:
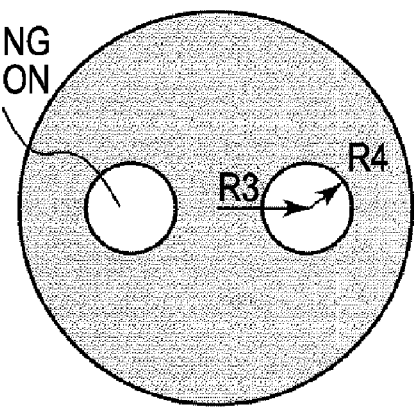
FIG. 9 is an illustration for describing parameters for a dipole illumination represented by a function.

There are two ways of setting the initial value of the light intensity distribution at the pupil plane in the illumination optical system: one is representation as a function and the other is representation in bitmap format. Examples of representation as a function are illustrated in FIGS. 7 to 9.

Figure 7:
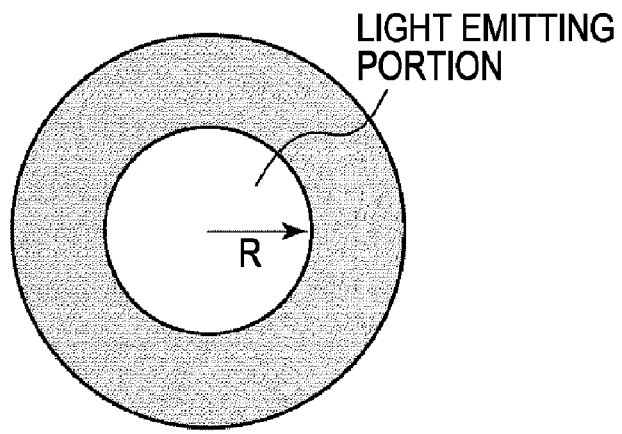
FIG. 7 is an illustration for describing parameters for a circular illumination represented by a function.

In the case of a normal (circular) illumination, as illustrated in FIG. 7, it is represented as a function whose parameter is the radius R from the center (optical axis). In the case of an annular illumination, as illustrated in FIG. 8, it is represented as a function whose parameters are the radius R1 of an inner circle and the radius R2 of an outer circle with respect to a light-emitting portion. In the case of a dipole illumination, as illustrated in FIG. 9, it is represented as a function whose parameters are the central position R3 of a circular light-emitting portion and the radius R4 of the light-emitting portion. In the case of a quadrupole illumination, settings similar to a case illustrated in FIG. 9 can be performed. Therefore, a parameter being the initial value is set for an illumination shape selected from a circular, annular, dipole, and other illuminations. The illuminance of the light-emitting portion may be uniform or exhibit a predetermined distribution.

Figure 10:
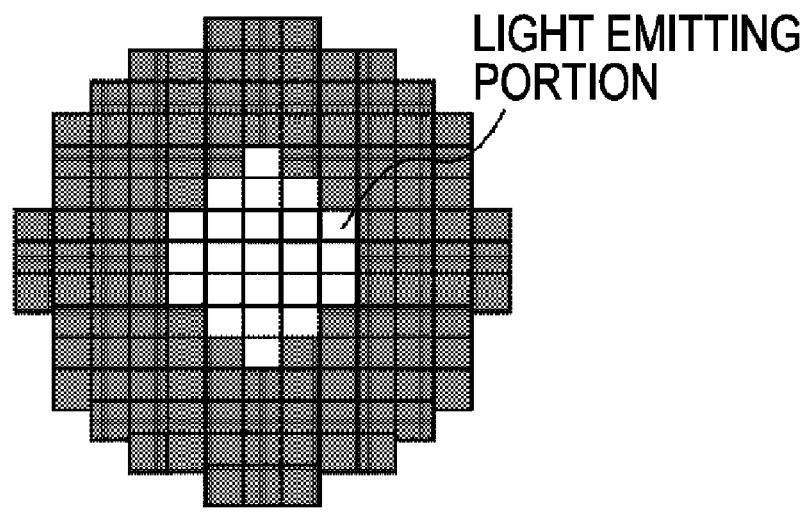
FIG. 10 illustrates a bitmapped illumination.

As for a way of representing the light intensity distribution in bitmap form, as illustrated in FIG. 10, the pupil plane in the illumination optical system can be fragmented in rectangular bitmap form, and the intensity of light for each bit can be set. Any value can be set as the initial value of each bit. For example, the initial value can be set as illustrated in FIG. 10. For the way of representing the light intensity distribution in bitmap form, only one initial value of the light intensity distribution at the pupil plane in the illumination optical system is set.

Figure 11:
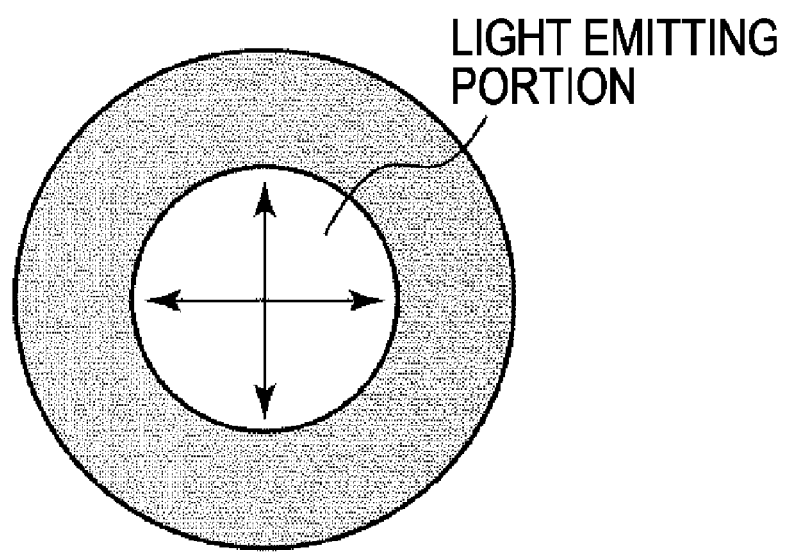
FIG. 11 illustrates polarized light of a circular illumination represented by a function.
Figure 12:
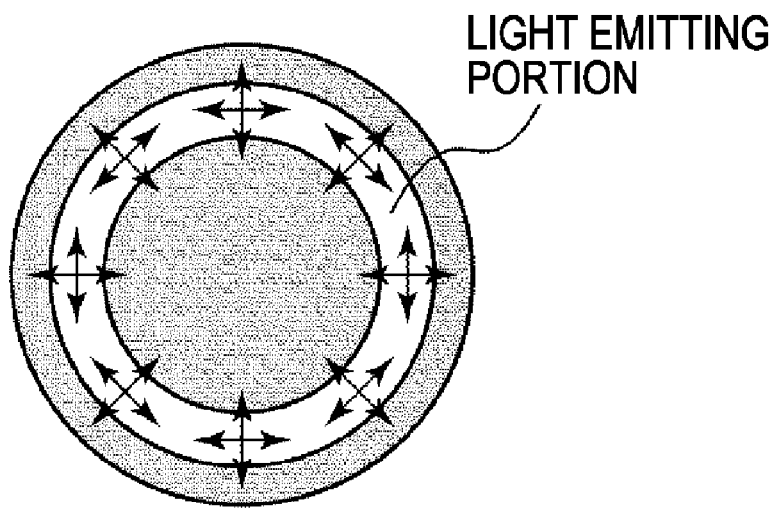
FIG. 12 illustrates polarized light of an annular illumination represented by a function.
Figure 13:
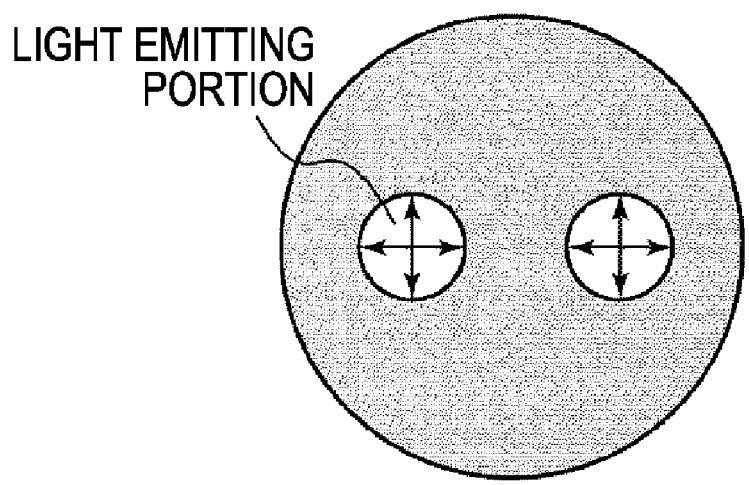
FIG. 13 illustrates polarized light of a dipole illumination represented by a function.

Similarly, there are two ways of setting the initial value of the degree of polarization of illumination light: one is that a distribution of the degree of polarization is represented as a function and the other is that it is represented in bitmap format. For representation as a function, when a circular light-emitting portion is used, as illustrated in FIGS. 7 and 9, polarized light beams traveling in two directions perpendicular to each other are set, as illustrated in FIGS. 11 and 13. In the case of an annular illumination, as illustrated in FIG. 8, a polarized light beam traveling in a radius direction and a light beam traveling in a circumferential direction with respect to the center of the optical axis are set, as illustrated in FIG. 12. Also for representation in bitmap form, a polarized light beam can be set for each bit. The illumination light may be unpolarized light.

Referring back to FIG. 1, in step S102, a pattern image to be projected on the wafer under the exposure condition set in step S101 is calculated by optical simulation. In this step, an image to be projected on an image plane (wafer surface) via the projection optical system after a layout pattern at an object plane (mask surface) is illuminated by the illumination optical system is calculated.

Then, in step S103, on the basis of an image to be projected on the wafer, an electrical characteristic of a portion for use in an interconnection from a pattern to be formed on the wafer is calculated. A pattern projected on the wafer and then formed on the wafer through a development process include various portions having different functions, such as that designed for use in an interconnection in a device and that designed for use in a transistor. Therefore, the entire pattern to be projected on the wafer is represented as parasitic parameters, such as resistance and capacity, and at least one of power consumption, disturbance of a wave form of an electric signal passing through the interconnection, and/or time for propagation delay of the electric signal for the entire device, a transistor, or an interconnection is calculated as an electrical characteristic. At this time, one or more of these electrical characteristics may be calculated.

The power consumption in a transistor or interconnection increases with a reduction in its line width. Therefore, as smaller line widths in a target pattern are achieved, it becomes increasingly important to consider the power consumption.

The disturbance of a wave form of an electric signal passing through the interconnection may be caused by electric noise or decay occurring when the electric signal passes through the interconnection. The occurrence of electric noise increases with a reduction in the distance between adjacent traces.

The interconnection is represented by resistance and capacity. The time for propagation delay of an electric signal passing through an interconnection is proportional to the product of capacity of the interconnection and resistance. Therefore, an increase in the capacity and resistance increases the time for propagation delay. Smaller line widths in a pattern increase the resistance in the interconnection and reduce the capacity. However, the capacity formed between adjacent interconnections is increased, and as a result, the time for propagation delay of an electric signal is undesirably increased by smaller line widths. The increase in the time for propagation delay adversely affects the results of operations in arithmetic circuits, such as a flip-flop circuit, a NAND circuit, and a NOR circuit.

In step S103, the electrical characteristic is calculated by use of a pattern composed of continuous curves to be actually formed on the wafer, not by use of layout data composed of rectangular figures of a layout pattern. Dimensional conversion for the pattern is performed as described below.

Figure 14:
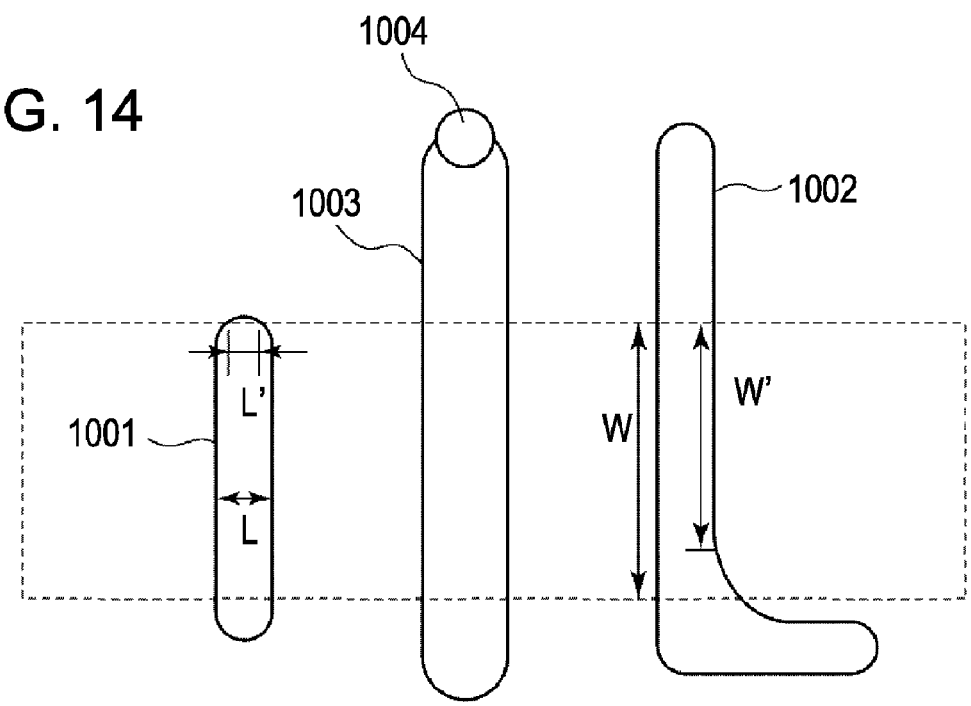
FIG. 14 illustrates a pattern projected on a wafer.

For example, it is assumed that a layout pattern of a device is projected on the wafer as a pattern image represented by solid lines as illustrated in FIG. 14. A region surrounded by dotted lines indicates a section where a transistor is to be formed. Therefore, a portion present within the region surrounded by the dotted lines is used as a gate in the transistor, whereas a portion outside the dotted lines is used as an interconnection.

In the pattern image projected on the wafer, because the edges of the layout pattern are round, portions become shorter. As a result, like a portion 1001 (a portion of a pattern), a section outside the dotted lines disappears and part of the round section is present within the region surrounded by the dotted lines. Because a source-drain current is mainly determined by the narrowest part in a gate, L' is set as the length of the gate of the transistor in the portion 1001, not L.

In the case of a portion 1002, which is curved adjacent to the dotted lines, a corner is rounded. When the curved portion is present inside the region surrounded by the dotted lines, the width of the gate is converted from W to W' (i.e., the length of a straight portion within the region surrounded by the dotted lines). This is because the source-drain current in the transistor is mainly determined by the narrowest part in the gate. This enables a round section not to be considered.

In the case of a portion 1003, which includes a round end and thus a shortened length and has a reduced contact area with a portion 1004 to be formed at a layer above or below the portion 1003, the contact resistance is increased by the amount corresponding to a noncontact area. This is because the contact resistance is inversely proportional to a contact area. As described above, the electrical characteristic is calculated in consideration of a layer above or below a pattern to be formed. At this time, positioning error of the mask stage 17 or the wafer stage 18 illustrated in FIG. 5 can be considered. In this case, the electrical characteristic of a device to be produced can be calculated with high accuracy.

A gate present outside the dotted lines is used as an interconnection and is thus not associated with a transistor. Therefore, a designed value is used without being changed, or, when the line width in a pattern image to be projected on the wafer is significantly different from the line width in a layout pattern, the width of interconnection is changed. The width of interconnection corresponds to resistance in terms of electrical characteristics.

Figure 15:
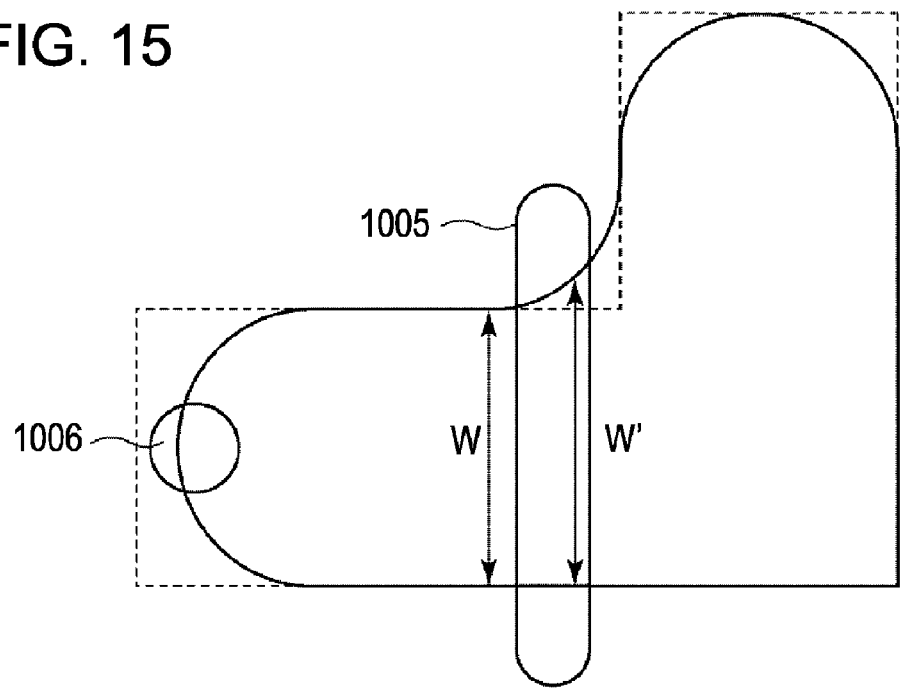
FIG. 15 illustrates a pattern projected on a wafer.

Also when a region indicated by dotted lines is formed as a region indicated by solid lines, as illustrated in FIG. 15, the gate width of a portion 1005 is changed from W to W' and the contact resistance in a portion 1006 is increased by the amount corresponding to a noncontact area.

As described above, the gate length and the contact resistance are extracted based on not a layout pattern but a pattern image to be projected on the wafer. Therefore, the electrical characteristic of a device to be actually produced can be calculated with high accuracy.

Now referring back to FIG. 1, in step S104, it is evaluated whether the electrical characteristic calculated in step S103 is appropriate. More specifically, a requirement is set, and the computer determines whether the electrical characteristic satisfies the requirement. For example, a maximum allowable value of power consumption in a transistor or interconnection is set as the requirement, and it is determined whether a calculated value is equal to or smaller than the maximum allowable value. With respect to time for propagation delay of an electric signal, a maximum allowable time is set as the requirement and it is determined whether a calculated value does not exceed the maximum allowable time. Alternatively, it may be determined on the basis of a result of logical operation (0 or 1) of a portion of a pattern for use as a flip-flop circuit or an arithmetic circuit.

A condition that allows an evaluated value to be optimized is derived from considered exposure conditions. If the requirement is satisfied in step S104, calculation is completed and data of the exposure condition set in step S101 is transmitted to the main control device 20 illustrated in FIG. 5. Then, the main control device 20 controls the illumination optical system, the projection optical system, the light source, and other elements, and exposure is performed.

If the requirement is not satisfied in step S104, the set exposure condition is adjusted and a new exposure condition is calculated in step S106. For example, the wavelength distribution of the light source can be increased, or two light sources whose peak wavelengths are different from each other can be used. Alternatively, for example, parameters for the illumination shape can be changed.

Once the exposure condition has been adjusted, steps S102 to S104 are repeated until a calculated electrical characteristic satisfies the requirement. If the requirement is satisfied, calculation is completed and data of the calculated exposure condition is transmitted to the main control device 20 in the exposure apparatus illustrated in FIG. 5.

Figure 17:
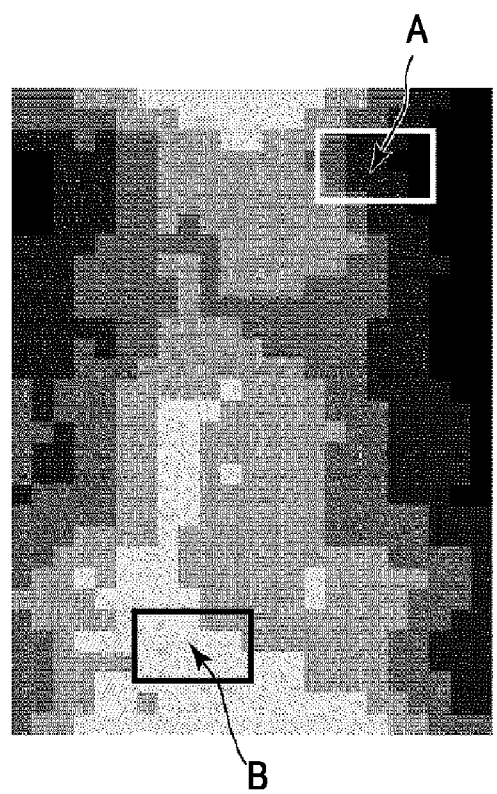
FIG. 17 illustrates electrical characteristics of a device under a given exposure condition according to the first embodiment.
Figure 18:
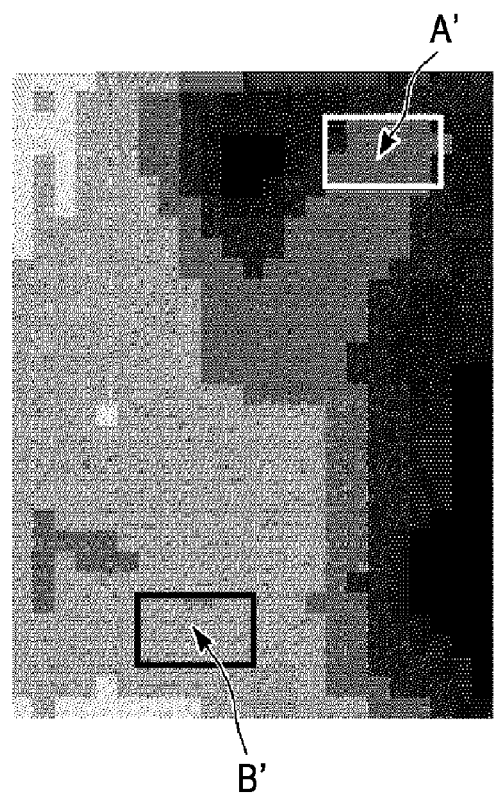
FIG. 18 illustrates electrical characteristics of a device under another exposure condition according to the first embodiment.

FIGS. 17 and 18 illustrate correspondence between an exposure condition and an electrical characteristic of a device. FIG. 17 illustrates an electrical characteristic in the entire layout under a given exposure condition. In FIG. 17, a high-contrast region has a poor electrical characteristic, and on the contrary, a low-contrast region has a good electrical characteristic. This electrical characteristic is derived from dimensional distribution characteristics of a pattern to be formed. FIG. 18 illustrates an electrical characteristic in the entire layout under an exposure condition different from that in FIG. 17.

The comparison between FIGS. 17 and 18 reveals that the electrical characteristic of regions A' and B' is better than that of regions A and B. The regions A, B, A', and B' are, for example, regions in which circuits important to a semiconductor device are present. As a result, manufacturing yield of semiconductor devices can be improved by performance of exposure under an exposure condition that enables an electrical characteristic illustrated in FIG. 18 to be exhibited.

As described above, manufacturing yield of devices can be improved by calculation of an exposure condition in consideration of an electrical characteristic of a device to be produced and performance of exposure under the calculated exposure condition. The exposure condition is set by transmission of data of the exposure condition obtained by the simulation computer 23 to the main control device 20 and control of settings of various components (e.g., a supporting member for an optical element) and a light source in the exposure apparatus. The wafer is subjected to exposure using the mask and the exposure apparatus whose exposure condition is set.

As a result, an exposure condition that can improve manufacturing yield of semiconductor devices can be calculated by use of a program or method for determining an exposure condition according to the present embodiment.

As line widths in a device circuit pattern become smaller, an exposure condition that can further improve manufacturing yield of devices can be calculated by consideration of an electrical characteristic of a portion of a pattern for use as interconnection of a device. This is because effects of the electrical characteristic of a portion of a pattern for use as interconnection in a device on the electrical characteristic in the entire device increases.

In the present embodiment, as described above, an electrical characteristic is calculated on the basis of a pattern image to be projected on a wafer. However, instead of this, a resist image to be formed on a photosensitive material by development of a pattern image to be projected on the photosensitive material may be calculated, and an electrical characteristic may be calculated on a result of the calculation. In this case, because the characteristics of the photosensitive material can be considered, the electrical characteristic of a device to be produced can be calculated with high accuracy in determination of an exposure condition. In addition, the resist image may be calculated in consideration of a step height between a layer where the resist image is to be formed and its lower layer.

In the present embodiment, the electrical characteristic is calculated for the entire layout for a device. However, a pattern image and an electrical characteristic may be calculated for at least one of blocks (e.g., a CPU, RAM, and ADC) to calculate an appropriate exposure condition. In this case, an exposure condition that allows improvement in manufacturing yield of devices can be readily calculated.

Additionally, information on an actual aberration in the projection optical system 14, the light intensity distribution, and/or the state of polarization at the pupil plane in the illumination optical system can be actually measured by use of the two-dimensional image sensor 16. In this case, the aberration information, the light intensity distribution, and/or the state of polarization may be captured in the computer 30 and be set as an initial value of an exposure condition, and then an appropriate exposure condition may be determined through steps S102 and S103.

When the present embodiment is realized by a program for use in a computer system, the program includes software code executable by a processor of a general-purpose computer. During execution of the software code, the software code and the associated data are stored in a memory in the computer. The software code or the associated data can be stored in another computer, thus allowing the program to be executed while the software code is transmitted and received among a plurality of computers. Therefore, the software code can be stored in a storage medium (e.g., compact-disk read-only memory (CD-ROM) and digital versatile disc ROM (DVD-ROM)) readable by at least one computer. Data of a program that includes the software code can be downloaded in the computer via a network, and the software code can be executed. The program discussed in the present embodiment can be described in the form of software code, as described above, and can function as one or more software applications.

Second Exemplary Embodiment

The second embodiment will now be described below. The second embodiment is different from the first embodiment in that, when the calculated electrical characteristic is inappropriate (the requirement is not satisfied), flow returns to the layout design to redesign the layout. The description similar to the first embodiment is not repeated below.

Figure 2:
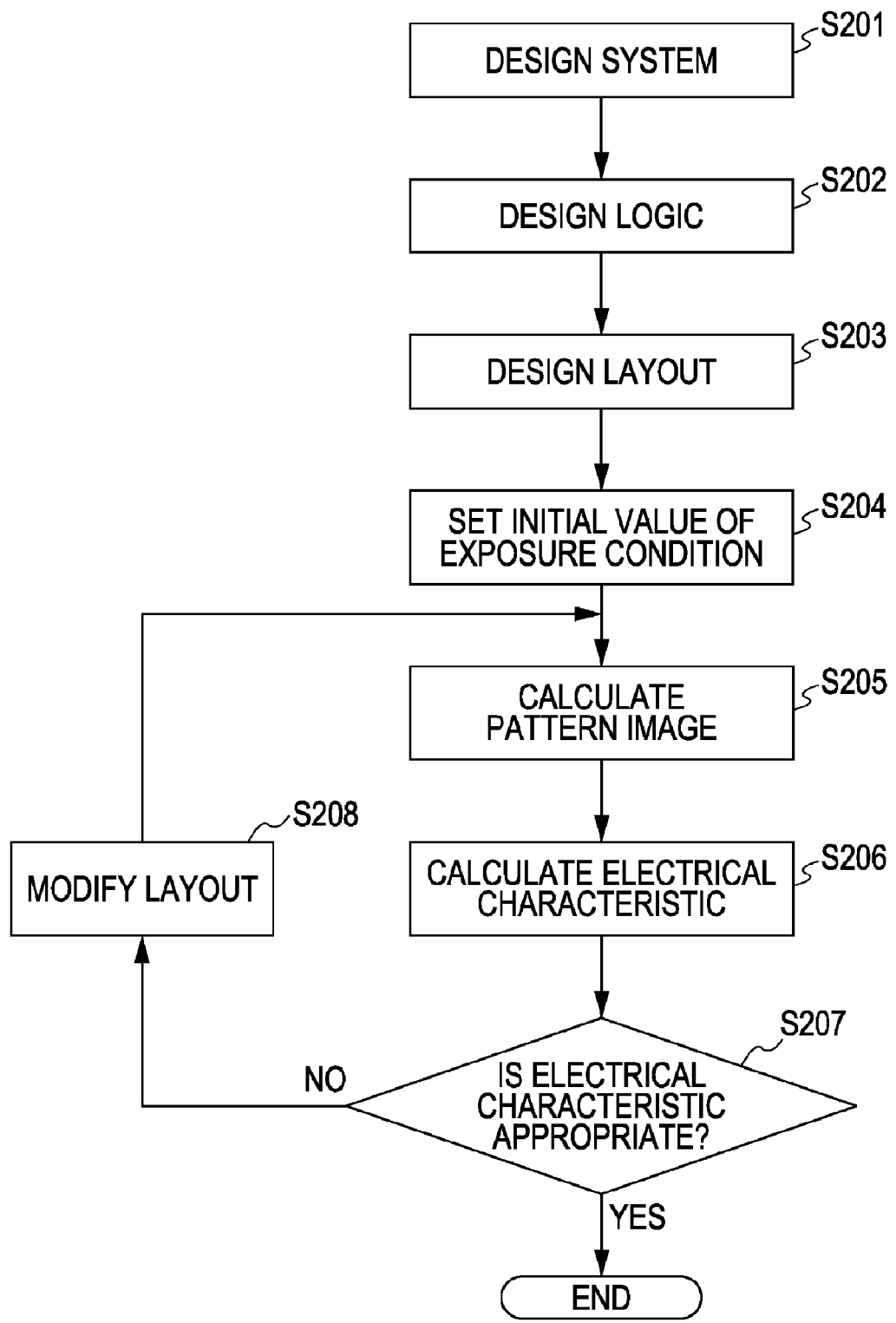
FIG. 2 illustrates an example processing flow in determining an exposure condition according to a second embodiment of the present invention.

FIG. 2 illustrates a processing flow in determining an exposure condition according to the second embodiment. First, in steps 201 to 203, as in the LSI design previously described, the system, logic, and layout of a device are designed. Then, steps S204 to S207 are performed based on data of the designed layout. If the calculated electrical characteristic satisfies the requirement in step S206, calculation is completed. If the calculated electrical characteristic does not satisfy the requirement in step S206, flow proceeds to step S208, where the device layout designed in step S203 is modified. For example, in LSI design, the position of each of the CPU, DSP, ROM, RAM, Logic, ADC, DAC, and PLL illustrated in FIG. 16 can be changed and/or the shape thereof can be changed. Interconnection between these elements is redesigned.

When the layout is redesigned, steps S205 to S207 are repeated until the requirement is satisfied by a calculated electrical characteristic. When the calculated electrical characteristic satisfies the requirement, calculation is completed. The calculated layout data is used as data for use in design of a mask pattern.

Figure 19:
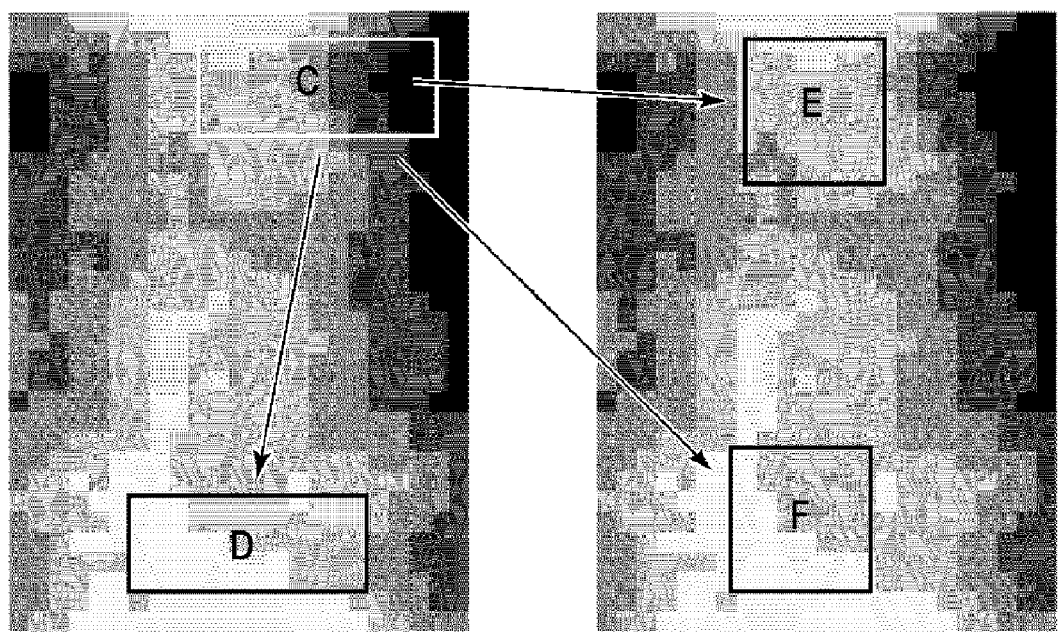
FIG. 19 illustrates how a device layout is changed according to the second embodiment.

For example, it is assumed that a result of calculation of an electrical characteristic in the entire device under a given exposure condition by simulation is illustrated in FIG. 19. In this case, a block present in a region C (for example, a CPU) can be moved to a region D, which has a better electrical characteristic, or alternatively, the shape of the block itself can be altered and the block can be moved to a region E or F, which has a better electrical characteristic. In FIG. 19, a high-contrast region indicates a region that exhibits a poor electrical characteristic, whereas a low-contrast region indicates a region that exhibits a good electrical characteristic, as with FIGS. 17 and 18.

According to the present embodiment, an exposure condition that enables improvement in manufacturing yield of devices can be determined by redesigning of the device layout.

Figure 20:
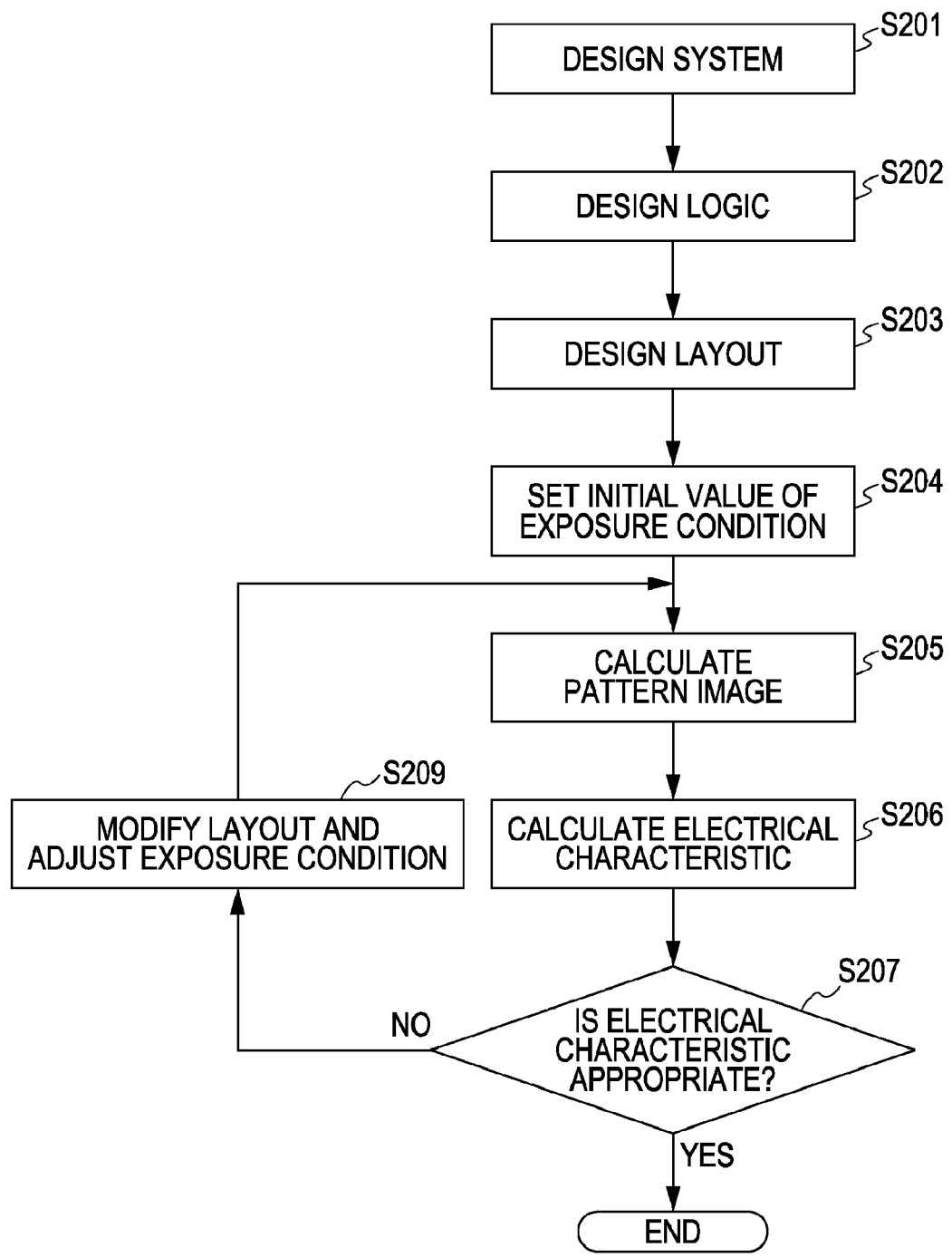
FIG. 20 is a flowchart for describing how a device layout and an exposure condition are modified according to the second embodiment.

As illustrated in step S209 in FIG. 20, both the device layout and the exposure condition may be modified. In this case, a more suitable solution (device layout and exposure condition) can be found. By exposure using the found solution, yield and/or resolution can be further improved.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures and functions.

This application claims the benefit of Japanese Application No. 2006-346256 filed Dec. 22, 2006, which is hereby incorporated by reference herein in its entirety.

What is claimed is:

1. A method for determining an exposure condition for use in projecting an image of a pattern of an original on a substrate, the method being executed by a computer, the method comprising:

a designing step of designing a layout of a device including macrocells;

a setting step of setting an exposure condition;

an image calculating step of calculating a dimension of an image to be projected on the substrate, in a case where a pattern of the designed layout is placed on a surface of the original, under the exposure condition set in the setting step;

an electrical characteristic calculating step of calculating an electrical characteristic of a pattern to be formed on the substrate in accordance with a result calculated in the image calculating step;

a determining step of determining whether the electrical characteristic calculated in the electrical characteristic calculating step satisfies a requirement; and a step of adjusting the exposure condition set in the setting step and modifying the layout of the device by changing the position of the macrocell while maintaining a shape of a pattern in the macrocells designed in the designing step when the electrical characteristic is determined not to satisfy the requirement in the determining step.

2. The method according to claim 1, wherein, in the electrical characteristic calculating step, at least one of a power consumption in an interconnection of the pattern to be formed on the substrate, disturbance of a wave form of an electric signal passing through the interconnection, and time for propagation delay of the electric signal is calculated as the electrical characteristic.

3. The method according to claim 1, wherein, in the electrical characteristic calculating step, on the basis of the dimension of the image calculated in the image calculating step, a dimension of the pattern to be formed on the substrate is changed, and the electrical characteristic is calculated using the changed dimension.

4. The method according to claim 1, wherein the exposure condition is at least one of wavelength distribution of a light source, a numerical aperture at an exit side in a projection optical system, σ, a light intensity distribution at a pupil plane of the illumination optical system, and the degree of polarization of illumination light.

5. The method according to claim 1, further comprising projecting an image of a pattern of an original on a substrate and exposing the substrate under a determined exposure condition.

6. A non-transitory computer-readable storage medium storing a program for causing a computer to execute computer-executable instructions for determining an exposure condition for use in projecting an image of a pattern of an original on a substrate, the medium comprising:

computer-executable instructions for designing a layout of a device including macrocells;

computer-executable instructions for setting an exposure condition;

computer-executable instructions for calculating a dimension of an image to be projected on the substrate, in a case where a pattern of the designed layout is placed on a surface of the original, under the exposure condition set in the setting step;

computer-executable instructions for calculating an electrical characteristic of a pattern to be formed on the substrate in accordance with a result calculated in the image calculating step;

computer-executable instructions for determining whether the electrical characteristic calculated in the electrical characteristic calculating step satisfies a requirement; and computer-executable instructions for adjusting the exposure condition set in the setting step and modifying the layout of the device by changing the position of the macrocell while maintaining a shape of a pattern in the macrocells designed in the designing step, when the electrical characteristic is determined not to satisfy the requirement in the determining step.

* * * * *